US011875867B2

(12) United States Patent
Lu et al.

(10) Patent No.: US 11,875,867 B2
(45) Date of Patent: Jan. 16, 2024

(54) WEIGHTED WEAR LEVELING FOR IMPROVING UNIFORMITY

(71) Applicant: Micron Technology, Inc., Boise, ID (US)

(72) Inventors: Zhongyuan Lu, Boise, ID (US); Karthik Sarpatwari, Boise, ID (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 17/545,335

(22) Filed: Dec. 8, 2021

(65) Prior Publication Data

US 2023/0178167 A1    Jun. 8, 2023

(51) Int. Cl.
*G11C 29/42* (2006.01)
*G11C 29/44* (2006.01)
*G11C 29/20* (2006.01)
*G11C 29/12* (2006.01)

(52) U.S. Cl.
CPC .......... *G11C 29/42* (2013.01); *G11C 29/1201* (2013.01); *G11C 29/12005* (2013.01); *G11C 29/20* (2013.01); *G11C 29/4401* (2013.01)

(58) Field of Classification Search
CPC .............. G11C 29/42; G11C 29/12005; G11C 29/1201; G11C 29/20; G11C 29/4401
See application file for complete search history.

(56) References Cited

U.S. PATENT DOCUMENTS

| 10,964,385 | B1* | 3/2021 | Yang | G11C 13/0069 |
|---|---|---|---|---|
| 2011/0096612 | A1* | 4/2011 | Steiner | G11C 11/5642 |
| | | | | 365/189.09 |
| 2012/0221772 | A1* | 8/2012 | Seol | G06F 13/1668 |
| | | | | 711/E12.008 |
| 2014/0016410 | A1* | 1/2014 | Choi | G11C 11/5642 |
| | | | | 365/185.03 |
| 2017/0162270 | A1* | 6/2017 | Park | G11C 16/26 |
| 2019/0043585 | A1* | 2/2019 | Banerjee | G11C 16/0433 |
| 2020/0350371 | A1* | 11/2020 | Pellizzer | H10N 70/883 |

* cited by examiner

*Primary Examiner* — Tuan T Nguyen

(74) *Attorney, Agent, or Firm* — LOWENSTEIN SANDLER LLP

(57) ABSTRACT

A memory device can include multiple memory cells and a processing device operatively coupled with the memory device to perform operations including grouping the memory cells into a groups based on a metric reflecting an electrical distance of a memory cell from a voltage source, and determining, for each group, a respective share of write operations, wherein the share of write operations is related to an aggregate value of the metric for memory cells of the group. The operations can also include distributing the write operations to each group according to the share of write operations determined for the group.

20 Claims, 6 Drawing Sheets

| Distribution of 100K Writes On Set of 10 Memory Cells (1 Bit per ED) | Near Electrical Distance (ED) | Middle ED | Far ED |
|---|---|---|---|
| Ratio (1:1:1) | 10K*3 | 10K*3 | 10K*4 |
| Ratio (1:5:25) | 800*3 | 4K*3 | 20K*4 |
| Ratio (1:10:100) | 250*3 | 2.5K*3 | 25K*4 |

WEIGHTED WEAR LEVELING FOR IMPROVING UNIFORMITY

TECHNICAL FIELD

Embodiments of the disclosure relate generally to memory sub-systems, and more specifically, relate to weighted wear leveling to improve uniformity in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
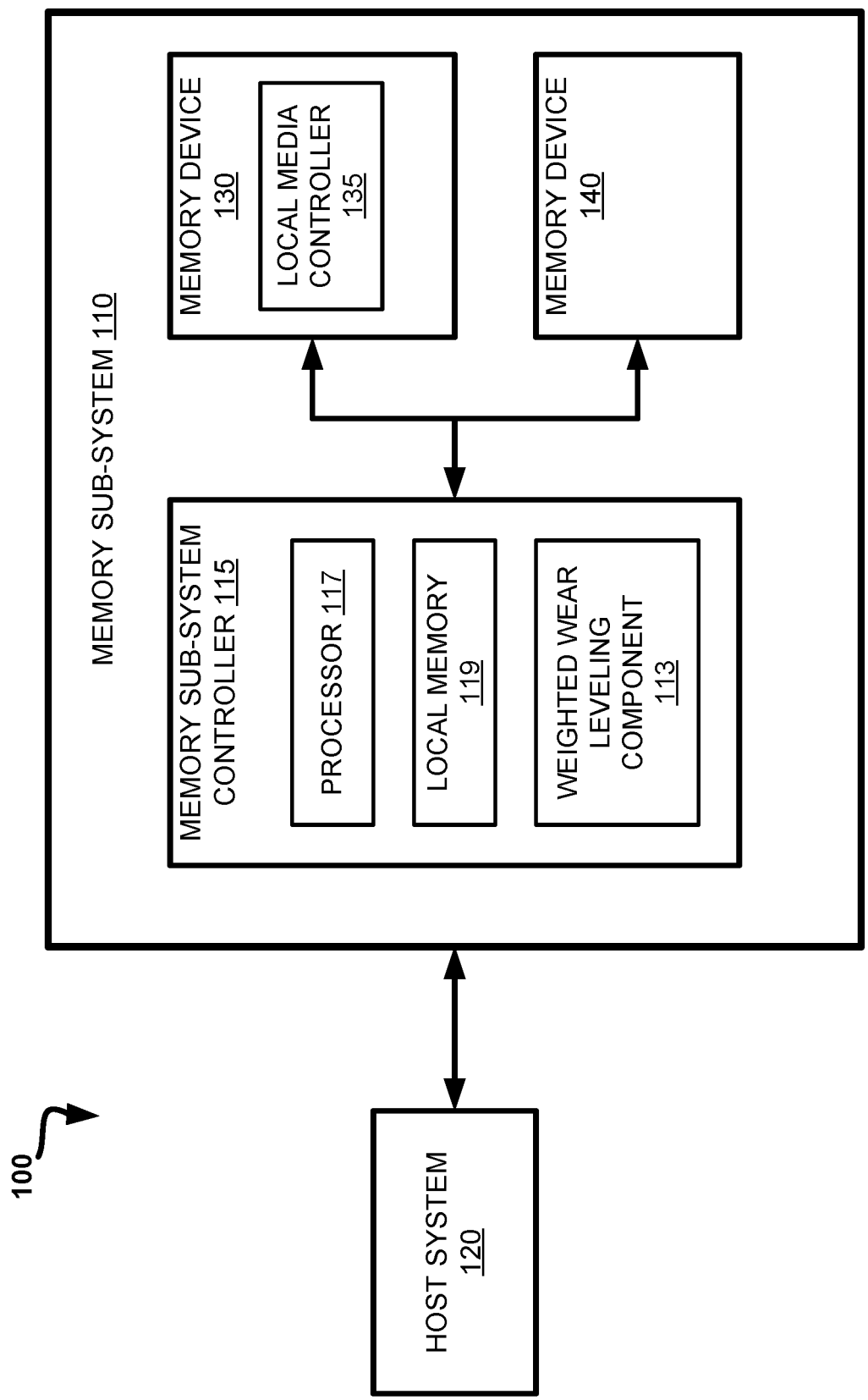
FIG. 1 illustrates an example computing system that includes a memory sub-system in accordance with some embodiments of the present disclosure.

Aspects of the present disclosure are directed to weighted wear leveling to improve uniformity in memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Some memory components, such as non-volatile memory devices can have limited endurance. The individual segments, data units, or blocks of the memory components can be written, read, and/or erased only a finite number of times before physical wear causes the memory components to fail. To counteract this limited endurance of memory components, techniques have been developed to manage wear on the memory components.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of cells arranged in a two-dimensional grid. Memory cells are etched onto a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., a row) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Accessing a memory cell (e.g., during a read or write operation) may include applying a non-zero voltage across the memory cell in order to either read (e.g., sense) a logic state stored by the memory cell or write (e.g., program) the memory cell to store a desired logic state. Memory cells within an array may be coupled to and located at the intersection of different conductive access lines. Therefore, accessing a memory cell can involve applying respective voltages to the different access lines coupled to the memory cell. Each access line may be coupled with a corresponding voltage source (e.g., by one or more vias or other interconnects, with the voltage sources located outside the array), and the distance of the current path (signal path) between a memory cell and the voltage source on the access line can be referred to as the electrical distance (ED) for the memory cell.

Memory cells with a relatively large ED relative to a voltage source may be referred to as far memory cells (or memory cells with far EDs), and memory cells with a relatively small ED may be referred to as near memory cells (or memory cells with near EDs). Memory cells with ED between the far and near memory cells may be referred to as middle memory cells (or memory cells with middle EDs). ED is directly related to the resistance that a signal/pulse from the voltage source needs to overcome on its way to a target memory cell.

Certain non-volatile memory devices can use a demarcation voltage ($V_{DM}$) to read data stored at memory cells. For example, the memory sub-system controller can apply the $V_{DM}$ to memory cells and if the threshold voltage ($V_t$) of a particular memory cell is determined to be below the $V_{DM}$ applied, then the data stored at the particular memory cell can be read as a particular value (e.g., a logical state of '1'). If the threshold voltage of the particular memory cell is determined to be above the $V_{DM}$, then the data stored at the particular memory cell can be read as a different value (e.g., a logical state of '0'). In certain memory devices, a threshold voltage of a particular memory cell or the threshold voltage distribution of multiple memory cells can shift or change over time. For example, a threshold voltage distribution of memory cells storing a logical state of '1' or a threshold distribution of memory cells storing a logical state of '0' can shift over time and the respective threshold voltage of a distribution can increase. When the threshold voltage of a memory cell changes, the application of the $V_{DM}$ can yield an incorrect result due to the changed $V_t$ (i.e., the data stored at the memory cell can be incorrectly interpreted when the $V_t$ of the memory cell shifts from below the $V_{DM}$ to above the $V_{DM}$.)

Accordingly, during the operating life of a memory device, the set state (e.g., a lower voltage level associated with a bit value of '1') and reset state (e.g., a higher voltage level associated with a bit value of '0') for a memory cell can register higher than expected voltage levels with respect to the predefined threshold voltage ($V_t$) read level. As such, a memory cell of a memory device that was programmed to a set state, could be interpreted by a read operation as a higher voltage level indicative of a reset state. This misinterpretation, in turn, can result in a higher error rate due to the aforementioned shift in observed voltage levels that can impact the representative voltage state of the affected memory cells. The size, in terms of a range of voltages, of the window (referred to as "read window") in which one can place the $V_{DM}$ and accurately distinguish the set and reset states is referred to as a read window budget (RWB). Thus the RWB can be considered to be the space (in terms of a range of voltage distributions) between the highest $V_t$ of a memory cell in the set state and the lowest $V_t$ of a memory cell in the reset state for a given group of memory cells.

The $V_t$ of the memory cells programmed to a particular state can often not be uniform across an array of memory cells in a memory device. The lack of uniformity can be due to some memory cells having been subject to more read/write operations than others. However, even under equal use (i.e., if all the memory cells are subjected to the same number of read/write operations), a non-uniform distribution of $V_t$ can occur due to the different impact each operation has on a cells located at different EDs from a voltage source. For example a signal/pulse (from a read/write operation) arriving at a target memory cell located at a near ED can have a different magnitude than a signal/pulse arriving at a target memory cell located at a far ED, and therefore degrade cells at different EDs at different rates. Accordingly, memory cells at nearer EDs can receive stronger signals and degrade faster than cells at farther EDs even if every memory cell is being used equally often.

Some memory devices can have the $V_t$ of memory cells located at different EDs shift at different rates. For example, stronger pulses (i.e., pulses of higher magnitude from the voltage source), higher spikes in snapping, and limitations to delivery of current caused by the resistance of conductive lines to which the memory cells are connected (e.g., bitlines wordlines) for cells located at near EDs from a voltage source can have cause a larger shift in $V_t$ or shift $V_t$ at a faster rate than for cells located at farther EDs. Snapping can refer to a sudden voltage drop across a memory cell (e.g., a cell with an ovonic switch). When the switch in the memory cell is turned on, the memory cell suddenly becomes more conductive so that the voltage bias on the memory cell drops down drastically resulting in a voltage spike due to discharge caused by the parasitic capacitance of the circuit.

Non-uniform distributions narrow the range of threshold voltages between the distribution of maximum $V_t$ for cells in a '1' programming state and minimum $V_t$ for cells in a '0' programming state and, consequently, narrow the available RWB for read operations. Moreover, due to non-uniform $V_t$ shifts, the distributions of maximum $V_t$ for cells in a '0' state are often shifted higher and consequently require higher voltages to be applied to the memory cell to select it for further subsequent programming.

The aforementioned challenges and resulting reliability issues can be addressed by performing repetitive cycles of specialized read or write operations on the memory device to stabilize the voltage levels of the memory cells. During these "seasoning" cycles, voltage pulses can be applied to the memory cells of the memory device to stabilize the voltage levels of the memory cells to predetermined set and reset voltage states. For example, the memory sub-system controller can load, from a data structure, an identified set of voltage pulses and apply them to a set of memory cells. The seasoning operations can include use of values that can be adjusted or tuned to modify the behavior and characteristics of the memory cells (referred to as "trim values") and can specify different voltage pulse shapes (e.g., pulse magnitude, pulses width, etc.), intensity, duration, etc. To obtain more uniform threshold voltages for memory cells of a memory device, pre-seasoning (seasoning prior to a memory device being put into regular operation) can be implemented, which applies a series of write operations to memory arrays of a memory device in which, memory cells at far EDs were subjected to higher stresses than those at nearer EDs prior to customer use (thus creating more uniformity of distributions of maximum $V_t$ for cells in a '1' programming state). However this approach does not account for $V_t$ shifts occurring after the memory device begins regular operation.

Similarly, post-seasoning (seasoning after a memory device is put into regular operation) can be implemented, with an equal share of write operations being performed on memory cells at near EDs as on memory cell at far EDs. However, post-seasoning also does not adequately account for differences in $V_t$ shifts for memory cells at different EDs. The wear/degradation caused by stronger pulses, higher spikes in snapping, different trim values, and limitations to delivery of current caused by the resistance of conductive lines will again have more of an effect on memory cells at near EDs than those on far EDs. This, consequently, will still result in non-uniformity of $V_t$ distributions. In some cases, the disparity in distributions can further be exacerbated for cells at near EDs because the rate of $V_t$ shift for cells at near EDs can be larger even if an equal share of write operations being performed on memory cells at near EDs as on memory cell at far EDs. In other words, seasoning cycles can induce greater detrimental effects on memory cells at near EDs and make the memory cells at near EDs degrade faster than those at farther EDs and make the distributions of $V_t$ across an array of memory cells even less uniform.

The endurance in a memory sub-system can be also managed by wear leveling. Wear leveling operations can attempt to evenly distribute the read, write and erase operations, and thus the corresponding physical wear, across the memory components. However, wear-leveling approaches that attempt to distribute write operations evenly within an array across all memory cells similarly fails to address or mitigate the undesirable difference in effects on $V_t$ on memory cells at different EDs noted earlier. If wear leveling is applied, memory cells at near EDs can still have lower $V_t$ and a greater $V_t$ shift than memory cells at far EDs even if all the memory cells receive the same total number of write operations (pulses).

Aspects of the present disclosure address the above and other deficiencies by implementing weighted wear leveling to improve uniformity of $V_t$ distributions in memory devices. Memory cells of a memory device can be grouped according to a metric related to their ED (e.g., ED from a voltage source, initial $V_t$ for a particular logical state, or rate of $V_t$ shift). A share of all write operations to be performed on the memory device can be determined and assigned for each group of memory cells. In this manner, in order to counteract the higher degradation (e.g., caused by stronger pulses, spikes in snapping, different trim values, etc.) typically occurring on memory cells at near EDs, a larger proportional share of write operations can be assigned to memory cells that are located at farther EDs than to memory cells that are located at nearer EDs. Moreover, in some embodiments, after some operations being performed on the memory device, the share of operations for each group can be determined again or reassigned based on the temperature (e.g., of the memory device, a die, a group of memory cells), a total number of write operations that has been performed (e.g., on the device, an array, a group of memory cells), or on a rate of $V_t$ shift.

Advantages of the embodiments of the present disclosure include, but are not limited to, stabilizing the RWB and keeping the RWB stable for a longer amount of time by establishing more uniform distributions of maximum $V_t$ for cells in a '1' programming state and minimum $V_t$ for cells in a '0' programming state. Advantages of stabilizing the RWB are coupled with lowering the distributions of maximum $V_t$ for cells in a '0' state which permits the selection of the memory cells for further programming to be achieved with the application of lower voltages than in conventional approaches. Thus the embodiments of the present disclosure improve the uniformity of $V_t$ distributions of the memory cells at all EDs throughout the operative lifetime of a memory device, extend memory device endurance, and optimize the selection of proper $V_{DM}$ within the RWB.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a weighted wear leveling component (WWLC) 113 that can divide a number of memory cells on the memory device 130 into groups based on a metric related to an electrical distance (ED) of a memory cell from its respective voltage source or a metric related to other characteristics of a memory cell. The WWLC can determine and assign a share of write operations to be performed for each group of memory cells. The shares can be apportioned by the WWLC 113 such that memory cells at farther EDs receive a larger share of the write operations than the memory cells at nearer EDs. Thus, when data is received by the WWLC 113 from host system 120 or from other components of the memory sub-system 110 to be stored on the memory device 130, WWLC 113 can perform the write operations according to the shares of write operations allocated to be performed on the particular groups of memory cells. In some embodiments, the memory sub-system controller 115 includes at least a portion of the weighted wear leveling component 113. In some embodiments, the weighted wear leveling component 113 is part of the host system 110, an application, or an operating system. In other embodiments, local media controller 135 includes at least a portion of weighted wear leveling component 113 and is configured to perform the functionality described herein.

The weighted wear leveling component 113 can receive data sent from host system 120 or from other components of the memory sub-system 110 to be stored on the memory device 130. Further, the WWLC 113 can group memory cells within memory arrays on memory device 130. Grouping the memory cells can be based on a metric reflecting a property or characteristic of the memory cells. For example, in some embodiments, the WWLC 113 can group the memory cells based on a metric reflecting an electrical distance of a memory cell from its voltage source. In other embodiments, the WWLC 113 can group the memory cells based on each cell's initial $V_t$ for a particular programming state. Similarly, the WWLC 113 can group the memory cells based on the rate of $V_t$ shift for each cell. The number of groups (e.g., 1, 2, 3, . . . 9000) that the WWLC 113 divides the memory cells can be arbitrarily large or small and can be predetermined based on the size and geometry of the memory device 130 and the memory arrays present on it.

In some embodiments, the weighted wear leveling component 113 can determine, for each group of memory cells, a respective share of write operations and assign that share of write operations to be performed on each group. The share of write operations determined to be performed for each group of cells can be related to an aggregate value of the metric for memory cells of the group. For example, the metric can be a value or a range of values associated with or reflective of an ED, an initial $V_t$ for a particular programming state, a shift of $V_t$ from the initial $V_t$ for a particular programming state, or a rate of $V_t$ shift for a particular programming state, of a cell in the group of cells.

Accordingly, in one embodiment, the WWLC 113 can divide the memory cells into, for example, three groups, where each group contains memory cells with particular ED values/value-ranges, as measured from their respective voltage sources, (i.e., located at particular EDs or within a range of EDs from their voltage source). Thus, each group of cells can be defined by a respective maximum ED and a respective minimum ED from the voltage source to the memory cells of the group (e.g., a group may contain memory cells with EDs between 1 and 2).

Similarly, in another embodiment, can divide the memory cells into, for example, five groups, where each group includes memory cells having particular initial $V_t$ values/value-ranges (i.e., memory cells that have a threshold voltage level for a particular '1'/'0' programming state that corresponds to a predetermined threshold level value or falls within a predetermined range of threshold voltage values). Accordingly, each group of memory cells can be defined by a maximum and minimum value of the metric based on which they are being grouped. For example, each group can be defined by a respective maximum and minimum initial threshold voltage $V_t$ (for a particular programming state) of the memory cells within the group. Similarly, the WWLC 113 can define each group by a respective maximum rate of $V_t$ shift and a respective minimum electrical rate of $V_t$ shift for the cells in the group. It should be understood by a person skilled in the art that, by analogy, there are a large variety of potential ways and combinations for grouping the memory cells into an arbitrary number of groups according to a metric reflective of a characteristic of the cells in each group and that all such grouping methods are contemplated herein.

In some embodiments, having assigned a particular share of write operations to be performed for each of the groups of memory cells, the weighted wear leveling component 113 can distribute the write operations for writing the data received for storage on the memory device 130. The WWLC 113 can distribute the write operations to each group of memory cells according to the share of write operations determined for the group. As explained in more detail with reference to FIG. 5, the shares of write operations can be assigned and distributed to the groups according to a proportional relationship between the groups. For example, if the memory cells are divided into three groups, the total amount of write operations to be performed can be determined to be proportionally distributed among memory cells located at near EDs (to their respective voltage source) grouped into a first group, memory cells located at middle EDs grouped into a second group, memory cells located at far EDs grouped into a third group. The proportional share of write operations that each group receives can vary depending on the balance of stress and degradation effects that is desired. For example, the share of write operations to be assigned to each of the three groups can be determined to be in a 1:1:1 ratio where each group receives the same proportional amount of write operations. In another example, the share of write operations to be distributed among the three groups can be determined to be in a 1:5:25 ratio whereby the second group receives 5 times more write operations than the first group and the third group receives 5 times more operations than the second group (i.e., 25 times more than the first group). It should be understood by a person skilled in the art that, by analogy, there are a large variety of potential proportions and combinations for allocating proportional shares of write operations to the various groups into which the cells have been divided/groups and that all methods of determining the proportional share of write operations to each of the groups are contemplated herein.

In some embodiments, in determining the share of write operations for each group of memory cells, the weighted wear leveling component 113 can determine the share of write operations should be inversely related (e.g., inversely proportional) to the aggregate value of the metric on which the grouping is based for the memory cells of the group. For example, a group with memory cells with a higher aggregate initial $V_t$ will get a smaller share of write operations than a group with memory cells having a lower aggregate initial $V_t$. In some embodiments, the weighted wear leveling component 113 can measure the rate of the shift of $V_t$ for the memory cells at a particular programming state and group the memory cells based on a rate of threshold voltage shift of each memory cell.

In other embodiments, the WWLC 113 can measure a temperature of the memory device (or an element thereof e.g., a die, a plane, a set of memory cells), and determine the share of write operations for each of the groups based on the measured temperature. For example, if the temperature is high more write operations can be distributed to one group than to another group while if the temperature is low less write operations can be distributed to the first group than to the other group. Similarly, the WWLC 113 can determine a total number of write operations performed on the memory device and a number of times an error correction code is triggered for a set of memory cells and use those factors as bases for re-determining/re-assigning shares of write operations to the respective groups of memory cells. Accordingly, in some embodiments the WWLC 113 can determine, for at least one of the group, the respective share of write operations based on a total number of write operations performed on the memory device. For example, it may be the case that initially the write operations are allocated among three groups according to a proportional relationship of 1:5:25, but after 5000 total write operations having been performed on the memory device 13, the WWLC 113 determines the share of write operations distributed among the three groups according to a proportional relationship of 1:10:100 (i.e., with each successive group receiving 10 times more write operations than the previous one).

While in some embodiments, the WWLC 113 can, as in previous examples divide the memory cells into an arbiter number of groups e.g., a first group, a second group, and a third group, and assign a respective share of write operations for each group such that N times more write operations are assigned for the first group than to the second group, and N times more write operations are assigned for the second group than for the third group, the shares of write operations distributed to each of the groups need not be in a whole number proportion relationship with each other. Moreover, in other embodiments, the WWLC 113 can detect error correction code (ECC) being triggered when operations are being performed on particular memory cells (i.e., for some set of one or more memory cell on an array of the memory device 130). In those embodiments, the WWLC 113 can determine, for at least one of the groups of memory cells the respective share of write operations based on a number of times an ECC is triggered for a set of memory cells in the group. Further details with regards to the operations of the weighted wear leveling component 113 are described below with reference to FIG. 3 and FIG. 4.

Figure 2:
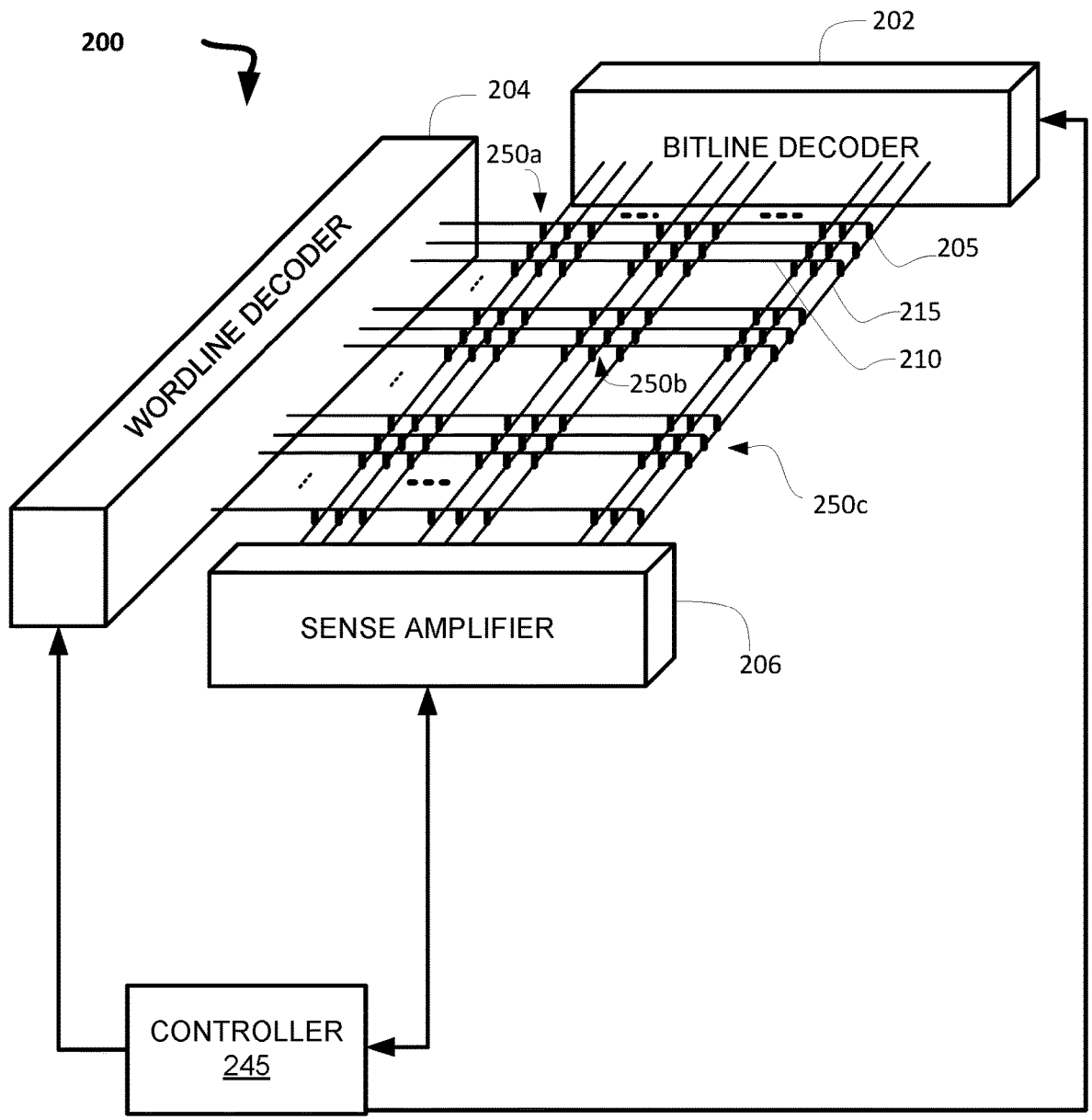
FIG. 2 illustrates an example array of memory cells in accordance with some embodiments of the present disclosure.

FIG. 2 is an illustration of example array of memory cells in accordance with some embodiments of the present disclosure. Memory array 200 can include multiple wordlines 210 (e.g., row lines) and multiple bitlines 215 (e.g., column lines), labeled. In some embodiments, each row of memory cells 205 is connected to a wordline 210, and each column of memory cells 205 is connected to a bitline 215. Activating or selecting a wordline 210 or a bitline 215 can include applying a voltage to the respective lines.

Wordlines 210 and bitlines 215 can be substantially perpendicular (i.e., orthogonal) to one another or otherwise intersect one another to create an array of memory cells. As shown in FIG. 2, one memory cell 205 can be located at the intersection of two conductive lines such as a wordline 210 and a bitline 215. This intersection can be referred to as an address of a memory cell 205. A target memory cell 205 can be a memory cell 205 located at the intersection of an energized wordline 210 and bitline 215; that is, wordline 210 and bitline 215 can be energized to read, write, or otherwise access a memory cell 205 at their intersection. Other memory cells 205 that are in electronic communication with (e.g., connected to) the same wordline 210 or bitline 215 can be referred to as untargeted memory cells 205.

Electrodes can be coupled to a memory cell 205 and a wordline 210 or a bitline 215. The term electrode can refer to an electrical conductor, and in some embodiments, can be employed as an electrical contact to a memory cell 205. An electrode can include a trace, wire, conductive line, conductive layer, or the like that provides a conductive path between elements or components of memory device 130. In some examples, a memory cell 205 can include multiple self-selecting or other memory components (e.g., a selection component and a storage component) separated from each other and from access lines 210, 215 by electrodes. For self-selecting memory cells 205, a single component (e.g., a section or layer of chalcogenide material within the memory cell 205) can be used as both a storage element (e.g., to store or contribute to the storage of a state of memory cell 205) and as a selector element (e.g., to select or contribute to the selection of the memory cell 105).

In some embodiments, operations such as reading and writing can be performed on memory cells 205 by activating or selecting a corresponding wordline 210 and bitline 215. Accessing memory cells 205 can be controlled through a wordline decoder 204 and a bitline decoder 202. For example, a wordline decoder 204 can receive a row address from the memory controller 245 (which can be a version of memory sub-system controller 110 or WWLC 113 of FIG. 1) and activate the appropriate wordline 210 based on the received row address. Such a process can be referred to as decoding a row or wordline address. Similarly, a bitline decoder 202 can receive a column address from the memory controller 245 and activate the appropriate bitline 215. Such a process can be referred to as decoding a column or bitline address. A wordline decoder 204 and/or bitline decoder 202 can be examples of decoders implemented using decoder circuitry, for example. In some embodiments, wordline decoder 204 and/or bitline decoder 202 can include circuitry that is configured to increase a voltage applied to a wordline 210 or bitline 215 (respectively).

In some embodiments, a memory cell 205 can be read (e.g., sensed) by a sense amplifier 206 when the memory cell 205 is accessed (e.g., in cooperation with the memory controller 245, wordline decoder 204, and/or bitline decoder 202) to determine a logic state stored by the memory cell 205. The sense amplifier 206 can provide an output signal indicative of (e.g., based at least in part on) the logic state stored by the memory cell 205 to one or more components (e.g., to the bitline decoder 202, the memory controller 245). In some embodiments, the detected logic state can be provided to a host system 120 (e.g., a device that uses the memory device 130 for data storage), where such signaling can be provided directly from the memory controller 245, memory sub-system controller 115, or WWLC 113.

In some embodiments, sense amplifier 206 can include various transistors or amplifiers to detect and amplify a difference in signals obtained based on reading a memory cell 205, which can be referred to as latching. The detected logic state of memory cell 205 can then be output through bitline decoder 202 as output. In some embodiments, sense amplifier 206 can be part of a bitline decoder 202 or row decoder 120. Alternatively, sense amplifier 206 can be connected to or in electronic communication with bitline decoder 202 or wordline decoder 204.

In some embodiments, read/write/erase operations can be performed on memory cells 205. The performance of such operations can be controlled by memory controller 245 (which can be a version of memory sub-system controller 110 or WWLC 113 of FIG. 1). Accordingly, operations, such as write operations to be performed on memory array 200 can be distributed among the memory cells 205. In one embodiment, the memory cells 205 can be grouped according to an aggregate value of a metric reflecting a property or characteristic of the memory cells of the group. For example, in the embodiment depicted in FIG. 2, some of the memory cells 205 of array 200 can be grouped into three groups, a first group 250a, a second group 250b, and a third group 250c. Each of the groups can have a value of a metric that that reflects a property or characteristic of the memory cells in the groups falling within a range of possible values. For example, in some embodiments, the memory cells 205 can be group based on a metric reflecting an ED of a memory cell 205 from its voltage source (e.g., bitline decoder 202 or wordline decoder 204). In that case, cells with near EDs can be grouped into group 250a, cells with middle EDs can be grouped into group 250b, and groups with far EDs can be grouped into group 250c.

In other embodiments, the memory cells 205 of array 200 can be divided into other number of groups and the groups such as, for example, first group 250a, second group 250b, and third group 250c can be based on values of metrics associated with other characteristics such as an initial $V_t$ for a particular programming state, a shift of $V_t$ from the initial $V_t$ for a particular programming state, or a rate of $V_t$ shift for a particular programming state, of a cell in the group of cells. Based on the groupings, a respective share of write operations can be assigned and distributed to each group 250a, 250b, 250c of memory cells 205. In some embodiments, a the share of write operations to be distributed among the groups in a proportional manner such that N times more write operations are assigned for the first group than to the second group, and N times more write operations are assigned for the second group than for the third group. For example, the respective shares of write operations assigned and distributed to the first group 250a, second group 250b, and third group 250c can be in a 1:5:25 proportional relationship whereby the second group 250b receives 5 times more write operations than the first group 250a and the third group 250c receives 5 times more operations than the second group 250b (i.e., 25 times more than the first group 250a). However, a person skilled in the art would understand that the respective shares of write operations distributed to each of the groups need not be in a whole number proportion relationship with each other and can be divided and distributed among the groups in any suitable combination.

Figure 3:
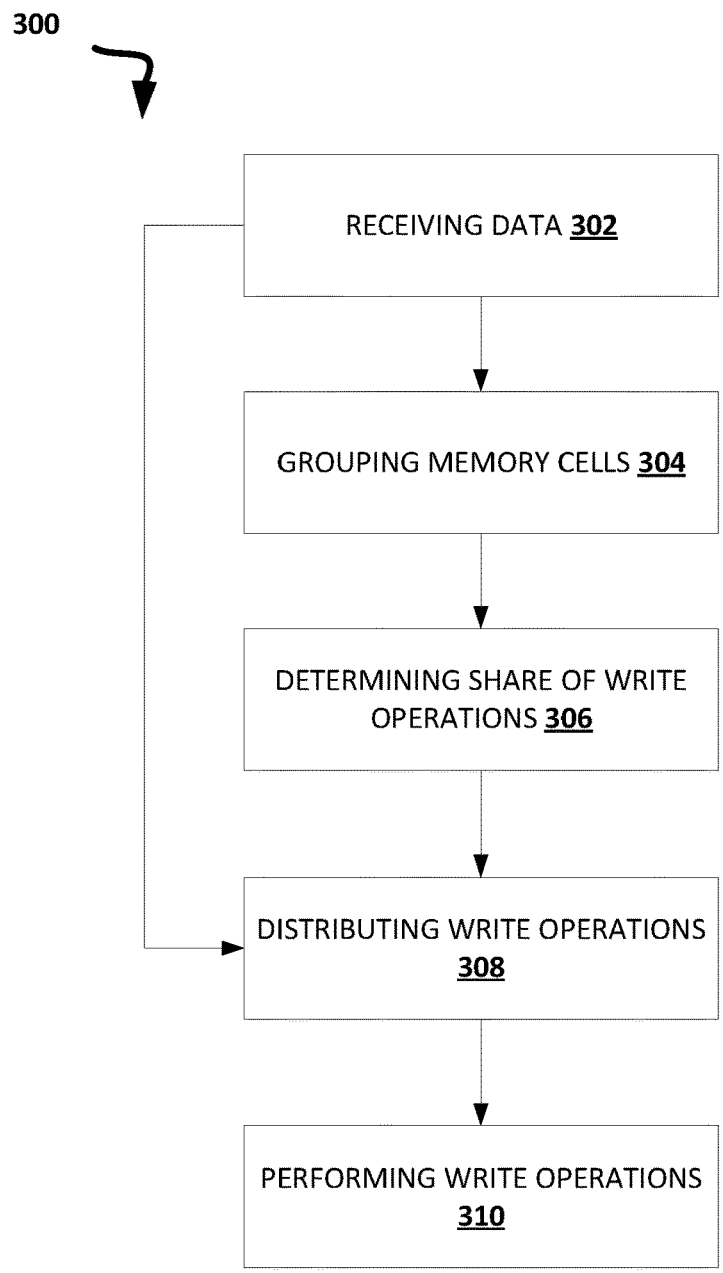
FIG. 3 is a flow diagram of an example method for weighted wear leveling in accordance with some embodiments of the present disclosure.

FIG. 3 is a flow diagram of an example method 300 to example method for weighted wear leveling in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the weighted wear leveling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 302, the processing logic can receive data sent from host system 120 or from other components of the memory sub-system 110 to be stored on the memory device 130. Further, at operation 304, the processing logic can group the memory cells of memory device 130 into groups. Grouping the memory cells into groups, at operation 304, can be based on a metric reflecting a property or characteristic of the memory cells (e.g., a value or a range of values associated with or reflective of an ED, an initial $V_t$ for a particular programming state, a shift of $V_t$ from the initial $V_t$ for a particular programming state, or a rate of $V_t$ shift for a particular programming state, of a cell in the group of cells). For example, in some embodiments, the processing logic can, at operation 304, group the memory cells based on a metric reflecting an electrical distance (ED) of a memory cell from its voltage source such that all cells associated with a particular ED or range of EDs are grouped into the same group of cells. In other embodiments, the processing logic can, at operation 304, group the memory cells based on each cell's initial $V_t$ for a particular programming state or based on the rate of $V_t$ shift (for a particular programming state) for each cell. The number of groups (e.g., 1, 3, 5, . . . 36000) that the processing groups the memory cells into can be arbitrarily large or small depending on the size and geometry of the memory device 130 and the memory arrays 200 present on it.

At operation 306, the processing logic can can determine, for each group of memory cells, a respective share of write operations and assign that share of write operations to be respectively performed on each group. The share of write operations determined, at operation 306, to be performed for each group of cells can be associated with an aggregate value of the metric for memory cells of the group. For example, the metric can be a value or a range of values associated with an ED, an initial $V_t$ for a particular programming state, a shift of $V_t$ from the initial $V_t$ for a particular programming state, or a rate of $V_t$ shift for a particular programming state, of all the cells in a particular group of cells (i.e., all the cells within a group have a metric value in common or a metric value that falls within a specified common range of metric values).

For example, the processing logic can, at operation 304, group the memory cells into, three groups, five groups, where each group includes memory cells having particular initial $V_t$ values/value-ranges (i.e., memory cells that have a threshold voltage level for a particular '1'/'0' programming state that corresponds to a predetermined threshold level value or falls within a predetermined range $V_t-n<V_t<V_t+n$ of threshold voltage values). Accordingly, each group of memory cells can be defined by a maximum and minimum value of the metric based on which they are being grouped. For example, each group can be defined by a respective maximum $V_t+n$ and minimum initial threshold voltage $V_t-n$ (for a particular programming state) of the memory cells within the group.

At operation 308, the processing logic can distribute the write operations for storing the data on the memory device 130 and perform, at operation 310, the write operations on the groups of cells. The processing logic can distribute the write operations to each group of memory cells according to the share of write operations determined for each respective group. In some cases, the processing logic can assign, at operation 306, and distribute, at operation 308, the respective shares of write operations to each of the groups according to a proportional relationship. For example, the processing logic can group the memory cells, at operation 304, into three groups based on ED from a respective voltage source. In that case, the total amount of write operations to be performed can be proportionally distributed by the processing logic at operation 308 in a 1:10:100 ratio respectively to a first group of memory cells located at near EDs, a second group of memory cells located at middle EDs, and a third group of memory cells located at far EDs whereby the second group receives 10 times more write operations than the first group and the third group receives 10 times more operations than the second group (i.e., 100 times more than the first group). The proportional share of write operations that each group receives can vary depending on the level of stress and degradation effects that is needed to be counteracted. In some embodiments, the processing logic can determine, at operation 306, and assign a share of write operations to each of the respective groups that is inversely related (e.g., inversely proportional) to the aggregate value of the metric on which the grouping is based. For example, the processing logic can assign a smaller share of write operations to a group with memory cells with a higher aggregate rate of $V_t$ shift than a group with memory cells having a lower aggregate rate of $V_t$ shift. In this case, the processing logic would have, at operation 304, defined each group by a respective maximum rate of $V_t$ shift and a respective minimum electrical rate of $V_t$ shift for the cells in the group.

Figure 4:
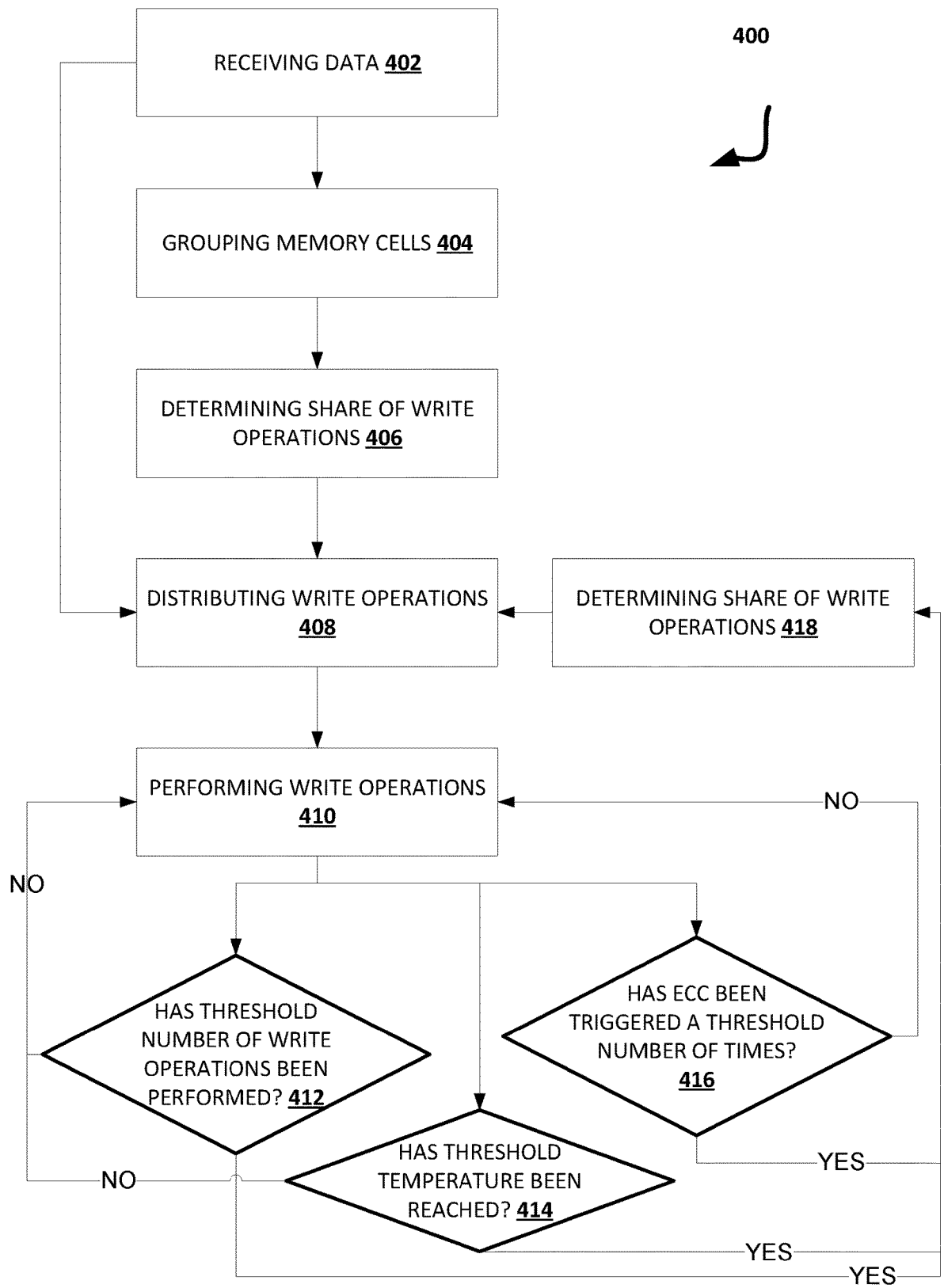
FIG. 4 is a flow diagram of an example method for weighted wear leveling in accordance with some embodiments of the present disclosure.

However, in some embodiments of the present disclosure, the shares of write operations among the groups of memory cells on memory device 130 can change dynamically during the operation of the memory device. One such embodiment is depicted in FIG. 4 which is a flow diagram of an example method 400 for dynamically adjustable weighted wear leveling in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the weighted wear leveling component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, operations 402-408 of method 400 can be analogous to operations 302-308 of method 300. For example, at operation 402 the processing logic can receive data and divide the memory cells of a memory device 130, at operation 404, into multiple groups based on a metric that reflects or is associated with a characteristic (e.g., initial threshold voltage, ED, etc.) of each memory cell. At operation 406, the processing logic can determine and assign a respective share of write operations for each of the groups such that the share of write operations assigned to a group is related to an aggregate value of the metric for the memory cells of that group (e.g., a direct relationship where a larger share of write operations is assigned to groups having a larger aggregate metric value, or an indirect relationship where a smaller share of write operations is assigned to groups having a larger aggregate metric value). The processing logic can, at operation 408, distribute the write operations to the groups of memory cells based on the shares determined at operation 408, and perform the share of operations at each of the respective groups of memory cells at operation 410.

However, during operation of the memory device 130, conditions affecting the degradation and endurance of the memory cells of the device can change. In response to these changes, the processing logic can make adjustments to the respective shares of write operations that are to be performed at each respective group of memory cells. For example, in some embodiments, the processing logic can, at operation 412, determine a total number of write operations that has been performed on the memory device 130 or on one of its components (e.g., a die, a plane, or a set of memory cells). Then the processing logic can, at operation 412, determine whether that total number of operations satisfies a predetermined threshold criterion (e.g., is larger than a predetermined threshold number of operation). If the processing logic, at operation 412, determines that the total number of operations satisfies the criterion, then the processing logic can, at operation 418, re-determine and re-assign respective shares of write operations to be performed at each of the respective groups of memory cells. For example, if the processing logic determines, at operation 412, that the total number of write operations performed exceeds 5000, it can, at operation 418, determine that the respective shares of write operations for each of three respective groups of memory cells are to be allocated according to a 1:6:40 proportional relationship (as compared to a previous relationship of 1:5:25).

In other embodiments, the processing logic can, at operation 414, measure or otherwise determine a temperature of the memory device 130 or one of its components (e.g., a die, a plane, or a set of memory cells). Then the processing logic can, at operation 414, determine whether that temperature satisfies a predetermined threshold criterion (e.g., is within a certain range of temperatures, exceeds a predetermined threshold temperature, or is below a predetermined threshold temperature). If the processing logic, at operation 414, determines that temperature satisfies the criterion, then the processing logic can, at operation 418, again determine/assign respective shares of write operations to be performed at each of the respective groups of memory cells. For example, if the processing logic determines, at operation 414, that the temperature is between 40° C. and 45° C., it can, at operation 418, re-determine that the respective shares of write operations for each of three respective groups of memory cell are to be allocated according to a 1:10:100 proportional relationship (as compared to a previous relationship of 1:1:1).

Similarly, in some embodiments, the processing logic can, at operation 416, detect or otherwise determine a number of times or frequency with which ECC is triggered for operations being performed on the memory device 130 or one of its components (e.g., a die, a plane, or a set of memory cells). Then the processing logic can, at operation 416, determine whether the number of times or frequency with which ECC is triggered satisfies a predetermined threshold criterion (e.g., exceeds a predetermined threshold number/frequency). If the processing logic, at operation 416, determines that determined number or frequency of ECC triggers satisfies the criterion, then the processing logic can, at operation 418, again reallocate respective shares of write operations among the respective groups of memory cells. For example, if the processing logic determines, at operation 418, that the ECC has been triggered more than 10 times in the past minute, it can, at operation 418, re-determine that the respective shares of write operations for each of three respective groups of memory cell are to be allocated according to a 1:20:50 proportional relationship (as compared to a previous relationship of 2:4:8).

Accordingly, having determined the shares of write operations to be performed on each of the respective groups of memory cells, the processing logic can at operation 408, distribute the operations to the groups, respectively and perform, at operation 410, the write operations at each of the respective groups according to the shares respectively assigned to each group.

Figure 5:
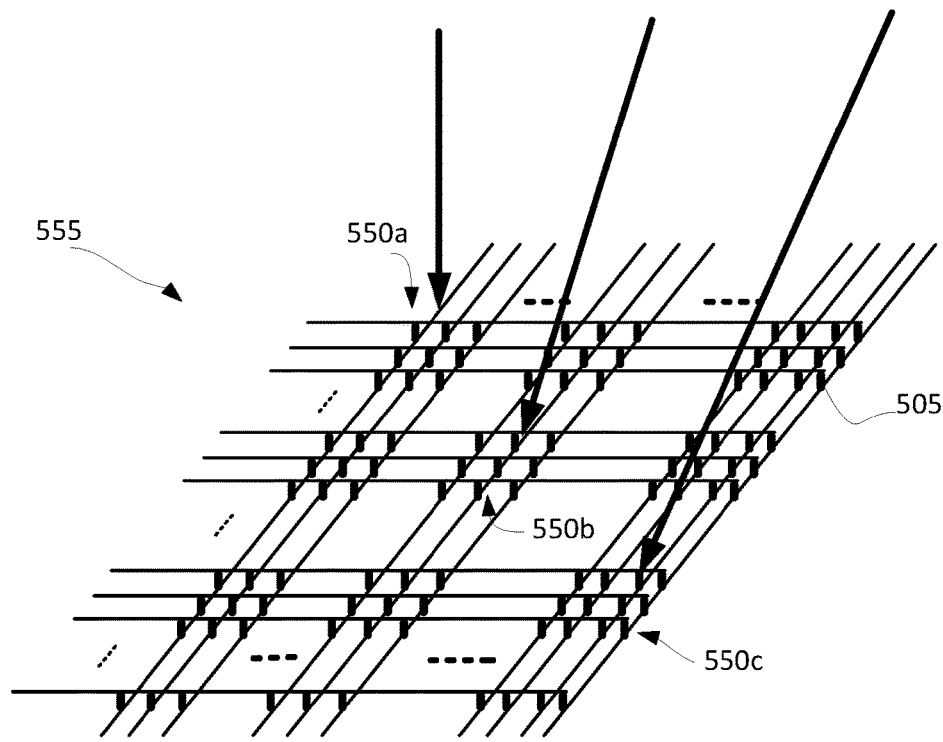
FIG. 5 illustrates an example scheme for distributing write operations to memory cells in an array in accordance with some embodiments of the present disclosure.

FIG. 5 illustrates an example scheme 500 for distributing write operations to memory cells in an array in accordance with some embodiments of the present disclosure. The depicted scheme 500 shows how, in some embodiments, one hundred thousand write operations can be distributed among a set of 10 memory cells 505 of a memory array 555 (which can be a version of array 200 of FIG. 2).

In some embodiments, the memory cells 505 can be grouped according to the methods and criteria described herein. In the depicted embodiment, a set of 10 memory cells 505 is divided into a first group 550a, a second group 550b, and a third group 550*c*. In some embodiments, cells with near EDs can be grouped into group 550*a*, cells with middle EDs can be grouped into group 550*b*, and groups with far EDs can be grouped into group 550*c*. In other embodiments, the first group 550*a* can include memory cells 505 with a low initial $V_t$, second group 250*b* can include memory cells 505 with a medium initial $V_t$, and third group 250*c* can include memory cells 505 with a high initial $V_t$ (relative to the other memory cells on the memory device 130).

FIG. 5 illustrates three scenarios according to which approximately one hundred thousand write operations can be distributed to each of the three groups 550*a*, 550*b*, and 550*c* of memory cells 505 with the assumption that there are 10 memory cells in total each of which stores 1 bit of information. In one embodiment, 3 of the 10 memory cells that have the nearest EDs (relative to their respective voltage sources) are grouped into group 550*a*, 4 of the memory cells that are located at the farthest EDs are grouped into group 550*c*, and the 3 remaining memory cells that have EDs between those of the 3 nearest and 4 farthest memory cells 505 are grouped into group 550*b*.

Noting that the distribution of the shares of write operations is approximate, under one scenario the write operations are distributed to the three respective groups according to a 1:1:1 ratio. Accordingly, ten thousand operations are distributed to each of the three memory cells 505 in group 550*a* located at EDs categorized as near EDs to result in a total of thirty thousand operations being performed on group 550*a*. Similarly, ten thousand operations are distributed to each of the three memory cells 505 in group 550*b* located at EDs categorized as middle EDs to result in a total of thirty thousand operations being performed on group 550*b*. Further, ten thousand operations are distributed to each of the four memory cells 505 in group 550*c* located at EDs categorized as far EDs to result in a total of forty thousand operations being performed on group 550*a*. Therefore, a total one hundred thousand write operations are distributed among group 550*a*, group 550*b*, and group 550*c*.

Under another scenario the write operations are distributed to the three respective groups according to a 1:5:25 ratio. Accordingly, 800 operations are distributed to each of the three memory cells 505 in group 550*a* located at EDs categorized as near EDs to result in a total of 2400 operations being performed on group 550*a*. Similarly, 4000 (i.e., 5 time more than 800) operations are distributed to each of the three memory cells 505 in group 550*b* located at EDs categorized as middle EDs to result in a total of 12000 operations being performed on group 550*b*. Further, 20000 (i.e., 25 time more than 800) operations are distributed to each of the four memory cells 505 in group 550*c* located at EDs categorized as far EDs to result in a total of 80000 operations being performed on group 550*a*. Therefore, a total of 94400 (approx. 100000) write operations are distributed among group 550*a*, group 550*b*, and group 550*c*.

Under yet another scenario the write operations are distributed to the three respective groups according to a 1:10:10 ratio. Accordingly, 250 operations are distributed to each of the three memory cell 505 in group 550*a* located at EDs categorized as near EDs to result in a total of 750 operations being performed on group 550*a*. Similarly, 2500 operations are distributed to each of the three memory cells 505 in group 550*b* located at EDs categorized as middle EDs to result in a total of 7500 operations being performed on group 550*b*. Further, 25000 operations are distributed to each of the four memory cells 505 in group 550*c* located at EDs categorized as far EDs to result in a total of 100000 operations being performed on group 550*a*. Therefore, a total of 108750 (approx. 100000) write operations are distributed among group 550*a*, group 550*b*, and group 550*c*.

Figure 6:
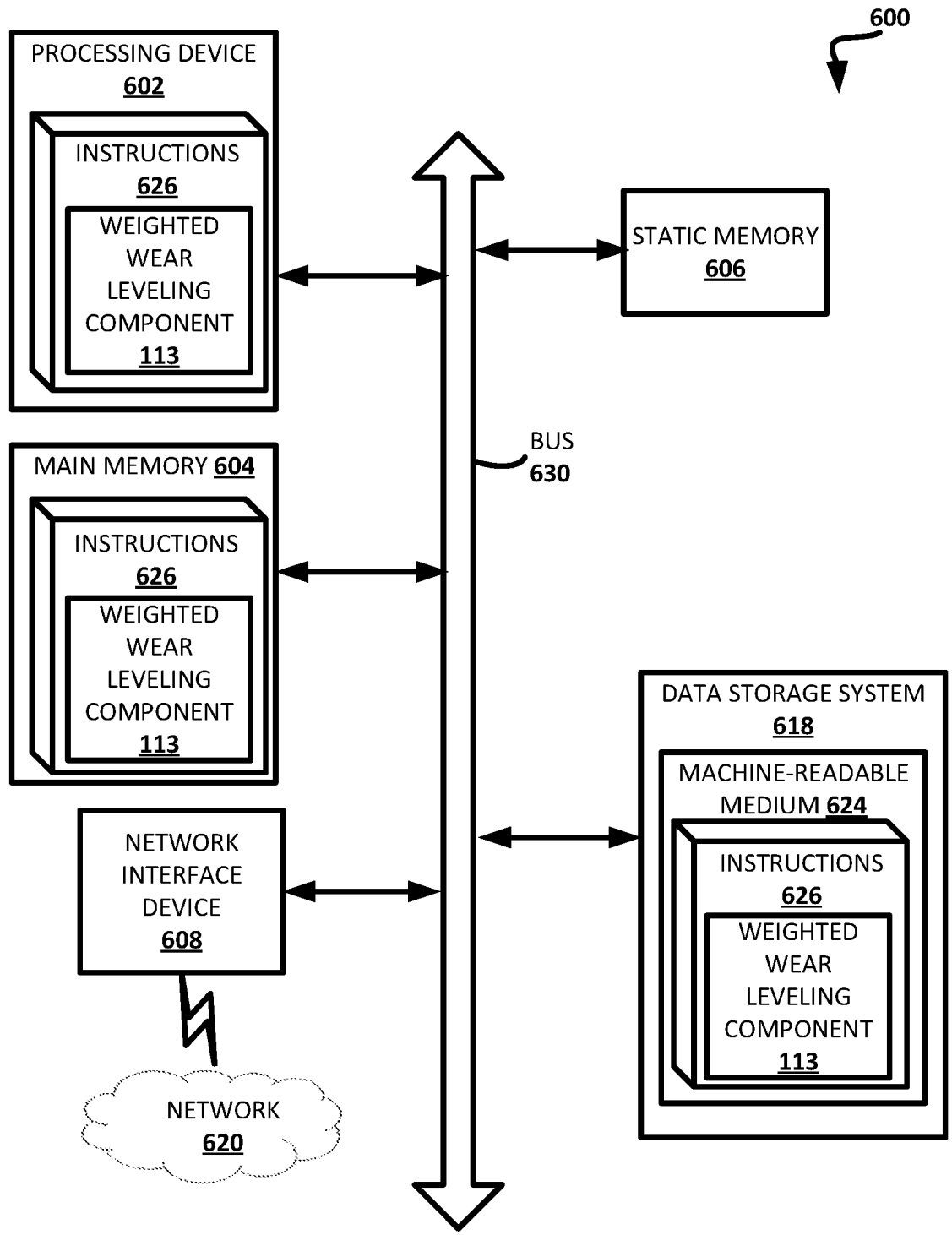
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the weighted wear leveling component 113 of FIG. 1, to method 400 of FIG. 4, or to method 500 of FIG. 5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a weighted wear leveling component (e.g., the weighted wear leveling component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory cells; and
a processing device operatively coupled with the memory device, to perform operations comprising:
grouping the plurality of memory cells into a plurality of groups based on a metric reflecting an electrical distance of a memory cell from a voltage source, wherein each group of the plurality of groups is defined by a respective maximum electrical distance and a respective minimum electrical distance from the voltage source to memory cells of the group;
determining, for each group of the plurality of groups, a respective share of write operations, wherein the share of write operations is related to an aggregate value of the metric for memory cells of the group; and
distributing the write operations to each group of the plurality of groups according to the share of write operations determined for the group.

2. The system of claim 1, wherein the share of write operations is inversely proportional to the aggregate value of the metric for the memory cells of the group.

3. The system of claim 1, wherein grouping the plurality of memory cells into the plurality of groups is based on a rate of threshold voltage shift of each memory cell.

4. The system of claim 1, wherein grouping the plurality of memory cells into the plurality of groups is based on a number of memory cells associated with a particular value of the metric.

5. The system of claim 1, wherein the processing device is to further perform operations comprising:
determining, for at least one group of the plurality of groups, the respective share of write operations based on a temperature of the memory device.

6. The system of claim 1, wherein the processing device is to further perform operations comprising:
determining, for at least one group of the plurality of groups, the respective share of write operations based on a total number of write operations performed on the memory device.

7. The system of claim 1, further comprising determining, for at least one group of the plurality of groups, the respective share of write operations based on a number of times an error correction code is triggered for a set of memory cells in the at least one group of the plurality of groups.

8. A non-transitory computer-readable storage medium comprising instructions that, when executed by a processing device, cause the processing device to perform operations comprising:
grouping a plurality of memory cells of a memory device into a plurality of groups based on a metric reflecting an electrical distance of a memory cell from a voltage source, wherein each group of the plurality of groups is defined by a respective maximum electrical distance and a respective minimum electrical distance from the voltage source to the memory cells of the group;
determining, for each group of the plurality of groups, a respective share of write operations, wherein the share of write operations is related to an aggregate value of the metric for memory cells of the group; and
distributing the write operations to each group of the plurality of groups according to the share of write operations determined for the group.

9. The non-transitory computer-readable storage medium of claim 8, wherein the share of write operations is inversely proportional to the aggregate value of the metric for the memory cells of the group.

10. The non-transitory computer-readable storage medium of claim 8, wherein grouping the plurality of memory cells into the plurality of groups is based on a rate of threshold voltage shift of each memory cell.

11. The non-transitory computer-readable storage medium of claim 8, wherein grouping the plurality of memory cells into the plurality of groups is based on a number of memory cells associated with a particular value of the metric.

12. The non-transitory computer-readable storage medium of claim 8, wherein the instructions further cause the processing device to perform the operations comprising:
determining, for at least one group of the plurality of groups, the respective share of write operations based on a temperature of the memory device.

13. The non-transitory computer-readable storage medium of claim 8, wherein the instructions further cause the processing device to perform the operations comprising:
determining, for at least one group of the plurality of groups, the respective share of write operations based on a total number of write operations performed on the memory device.

14. The non-transitory computer-readable storage medium of claim 8, wherein the instructions further cause the processing device to perform the operations comprising:
determining, for at least one group of the plurality of groups, the respective share of write operations based on a number of times an error correction code is triggered for a set of memory cells in the at least one group of the plurality of groups.

15. A method comprising:
dividing a plurality of memory cells of a memory device into a plurality of groups based on a metric reflecting an initial threshold voltage of each memory cell;
assigning, for each group of the plurality of groups, a respective share of write operations, wherein the share of write operations is related to an aggregate value of the metric for memory cells of the group; and
performing write operations on the memory cells in each group based on the share of write operations respectively assigned to each group.

16. The method of claim 15, wherein each group of the plurality of groups is defined by a respective maximum and minimum initial threshold voltage of memory cells within each group.

17. The method of claim 16, wherein dividing the plurality of memory cells into the plurality of groups comprises dividing the plurality of memory cells in a first group, a second group, and a third group, and wherein assigning respective share of write operations for each group comprises assigning N times more write operations for the first group than to the second group, and N times more write operations for the second group than for the third group.

18. The method of claim 15, further comprising:
reassigning the respective share of write operations for one or more of the groups based on a temperature of the memory device, a total number of write operations performed, or a number of times an error correction code is triggered for a set of memory cells in at least one of the groups.

19. The method of claim 15, wherein each group of the plurality of groups is defined by a respective maximum electrical distance and a respective minimum electrical distance from a voltage source to memory cells of the group.

20. The method of claim 15, further comprising:
determining, for at least one group of the plurality of groups, the respective share of write operations based on a number of times an error correction code is triggered for a set of memory cells in the at least one group of the plurality of groups.

* * * * *